United States Patent
Matsumoto

(10) Patent No.: US 6,927,720 B2
(45) Date of Patent: Aug. 9, 2005

(54) ANALOG SIGNAL OUTPUTTING CIRCUIT AND MULTI-LEVEL DELTA-SIGMA MODULATOR EMPLOYING THE ANALOG SIGNAL OUTPUTTING CIRCUIT

(75) Inventor: Tetsuya Matsumoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/948,654

(22) Filed: Sep. 24, 2004

(65) Prior Publication Data

US 2005/0078023 A1 Apr. 14, 2005

(30) Foreign Application Priority Data

Oct. 8, 2003 (JP) ....................................... 2003-350126

(51) Int. Cl.[7] .............................................. H03M 1/66
(52) U.S. Cl. ....................... 341/150; 341/143; 341/144
(58) Field of Search ............................... 341/143, 144, 341/145, 118, 172, 126, 110, 150

(56) References Cited

U.S. PATENT DOCUMENTS 5,257,026 A * 10/1993 Thompson et al. ......... 341/118
5,274,375 A * 12/1993 Thompson ................. 341/143
6,642,873 B1 * 11/2003 Kuang ....................... 341/143

FOREIGN PATENT DOCUMENTS

| JP | 6-224772 | 8/1994 |
| JP | 6-276099 | 9/1994 |
| JP | 2001-94429 | 4/2001 |

* cited by examiner

Primary Examiner—John B Nguyen
(74) Attorney, Agent, or Firm—McGinn & Gibb, PLLC

(57) ABSTRACT

An analog signal outputting circuit comprises two unit analog circuits for outputting an analog signal, corresponding to levels "−1" or "1", and a low-pass filter for smoothing the analog signal output from the two unit analog circuits, as selected by codes output from the four-valued delta-sigma modulator. In case the input signal is −2 or +2, outputs of the unit analog circuits are summed together to output an analog signal corresponding to −2 or +2. In case the input signal is −1 or +1, outputs of the unit analog circuits are alternately used to output an analog signal corresponding to −1 or +1 to reduce the non-linearity error resulting from variations in the analog devices.

12 Claims, 13 Drawing Sheets

FIG. 2
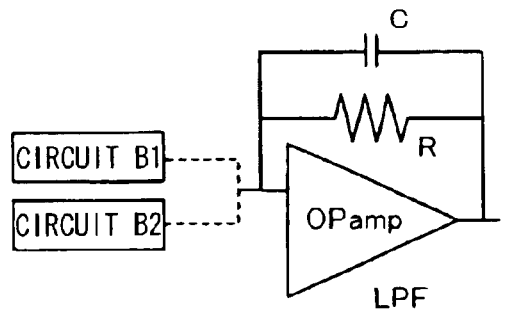
FOR INPUT SIGNAL (+2)    CIRCUIT B1    EACH DEVICE IS USED AS +1
                         CIRCUIT B2    TO REALIZE +2 WITH TWO
                                       DEVICES
                                       EACH DEVICE IS USED AS +1
FOR INPUT SIGNAL (+1)    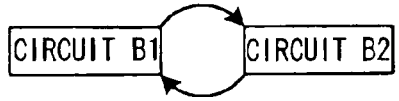
                                       EACH DEVICE IS USED AS −1
FOR INPUT SIGNAL (−1)    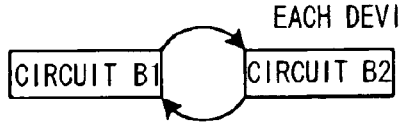
FOR INPUT SIGNAL (−2)    CIRCUIT B1    EACH DEVICE IS USED AS −1
                         CIRCUIT B2    TO REALIZE −2 WITH TWO DEVICES

ANALOG SIGNAL OUTPUTTING CIRCUIT

ANALOG SIGNAL OUTPUTTING CIRCUIT AND MULTI-LEVEL DELTA-SIGMA MODULATOR EMPLOYING THE ANALOG SIGNAL OUTPUTTING CIRCUIT

FIELD OF THE INVENTION

This invention relates to a technique of converting a multi-level quantized signal into an analog signal. More particularly, it relates to an analog signal outputting circuit convenient for a circuit for converting a signal processed with multi-level quantization in a multi-level delta-sigma modulator into a multi-level analog signal.

BACKGROUND OF THE INVENTION

The delta-sigma modulator is widely used in the fields of audio or communications, and a variety of techniques have so far been proposed for constructing a DA converter or an AD converter using the delta-sigma modulator (see Patent Documents 1 to 3).

FIG. 12 is a block diagram showing an illustrative conventional structure in which the delta-sigma modulator is applied to a D/A converter. In FIG. 12, a digital signal is input to a delta-sigma modulator 121 and thereby modulated into a bi-level (1 bit) output having two levels of +1 and −1. This output is processed by a low-pass filter (LPF) 122 and output as an analog signal.

An output of the delta-sigma modulator is a pulse density modulated input signal having the spectrum containing an input signal spectrum and a spectrum in which the quantization noise is shaped to a frequency range. This output is passed through a low-pass filter (LPF) 122 to take out only the desired frequency range to produce a converted output.

On the other hand, it has also been proposed to provide for a multi-level (multi-bit) output of the delta-sigma modulator, in order to reduce the quantization noise of the delta-sigma modulator to raise its conversion precision or in order to reduce the sampling frequency to achieve high SN and low power consumption (see Patent Documents 1 and 3). With the multi-level output of the delta-sigma modulator, a D/A converter, designed to accommodate the multi-level output, has to be provided as an internal D/A converter for converting the multiple quantization levels into an analog signal.
[Patent Document 1]
Japanese Patent Kokai Publication No. JP-A-6-224772
[Patent Document 2]
Japanese Patent Kokai Publication No. JP-A-6-276099
[Patent Document 3]
Japanese Patent Kokai Publication No. JP-P2001-94429A

SUMMARY OF THE DISCLOSURE

However, since the non-linearity error produced in the local digital-to-analog converting circuit, outputting an analog signal, corresponding to the multiple levels, limits the overall conversion accuracy (linearity) of the delta-sigma modulator, the delta-sigma modulator is susceptible to variations in the manufacture values, such that, in actuality, it is difficult to achieve high conversion accuracy. In order to overcome this deficiency, the conventional practice for coping with the multiple levels is to trim a device configured for outputting an analog signal corresponding to the multiple levels in an analog circuit, for thereby improving the accuracy of the analog signal outputting device. However, in this case, the manufacture is complicated and onerous.

For eliminating this deficiency, the Patent Document 1 proposes providing a memory for storage of non-linearity compensation parameters, and a digital filter operating in accordance with filter coefficients stored in this memory, and sending an output of the multi-level delta-sigma modulator to this digital filter, for compensating the non-linearity present in the multi-level delta-sigma modulator by the digital filter. On the other hand, the Patent Document 1 proposes providing a digital delta-sigma modulator, configured for outputting a one-bit signal, downstream of an analog delta-sigma modulator, including a multi-bit modulator, and feeding back a delayed version of a one-bit signal output from the digital delta-sigma modulator to the upstream side analog delta-sigma modulator, for reducing the signal distortion caused by the non-linearity error.

The techniques, disclosed in these Patent Documents, suffer from a problem that it is necessary to provide a memory for storage of non-linearity compensation parameters, and a digital filter operating in accordance with filter coefficients stored in the memory, or to employ an analog delta-sigma modulator and a digital delta-sigma modulator, in order to compensate for non-linearity errors produced in the local digital-to-analog converter, thus complicating the structure.

Accordingly, it is an object of the present invention to provide means for reducing the non-linearity error in e.g. a local digital-to-analog converter, adapted for outputting an analog signal corresponding to multi-levels, by a relatively simplified configuration.

The above and other objects are attained by a local digital-to-analog converter for outputting an analog signal, accommodating multiple levels, in accordance with one aspect of the present invention, which is formed as a multi-level analog signal outputting circuit receiving as an input codes corresponding to 2N levels (−N, −N+1, ..., −2, −1, 1, 2, ..., N−1, N, N being an integer not less than 2), for outputting an analog signal corresponding to the input code, and includes N pieces of unit analog circuits each outputting an analog signal corresponding to a level "−1" or "1", means for outputting an analog signal corresponding to a code −N or N, by summing outputs of the N pieces of unit analog circuits together, when the code corresponding to −N or N is input, and for outputting an analog signal corresponding to a code −M or M, M being an integer such that $1 \leq M \leq N-1$, by summing outputs of M unit analog circuits, selected from the N pieces of unit analog circuits, when the code corresponding to −M or M, is input, and means for sequentially switching, each time the same code corresponding to the −M or M is input, the selected M unit analog circuits to respective different combinations of M unit analog circuits, in accordance with combinations afforded from the N pieces of unit analog circuits by $_NC_M$, where C is an operator representing the combination.

In case codes corresponding to four-valued (−2, −1, 1 and 2) levels are input, the multi-level analog signal outputting circuit according to the present invention comprises two unit analog circuits each outputting an analog signal corresponding to a level "−1" or "1", means for outputting an analog signal corresponding to a code −2 or 2, by summing outputs of the two unit analog circuits together, when the code corresponding to −2 or 2 is input, and for outputting an analog signal corresponding to a code −1 or 1, by an output of one unit analog circuit as selected from the two unit analog circuits, when the code corresponding to −1 or 1, is input, and means for alternately selecting, each time the same code corresponding to the −1 or 1 is input, the sole unit analog circuit as selected from the two unit analog circuits.

The unit analog circuit according to the present invention may be configured by a switched capacitor (SC) circuit made up by a voltage source, supplying the voltage corresponding to a level "−1" or "1", a capacitor, and a switch for outputting an analog signal equivalent to the level "−1" or "1", by being controlled to be turned on or off by an external control clock signal and by controlling the capacitor as to the charging/discharging of electric charge from the voltage source.

The meritorious effects of the present invention are summarized as follows.

According to the present invention, a plural number of 1-bit analog circuits, outputting an analog signal, corresponding to the level "−1" or "1", are provided, a number of analog circuits, corresponding to the output levels, are selected, and the combinations of the selection are sequentially switched in case of outputting signals of the same sort, so that, even in case the analog devices suffer from variations, the error ascribable to these variations may be taken up, and hence it is unnecessary to provide e.g. a step of trimming the analog device.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2 is an explanatory view showing the configuration and an operation of an analog signal outputting circuit of the first embodiment.

PREFERRED EMBODIMENTS OF THE INVENTION

Figure 1:
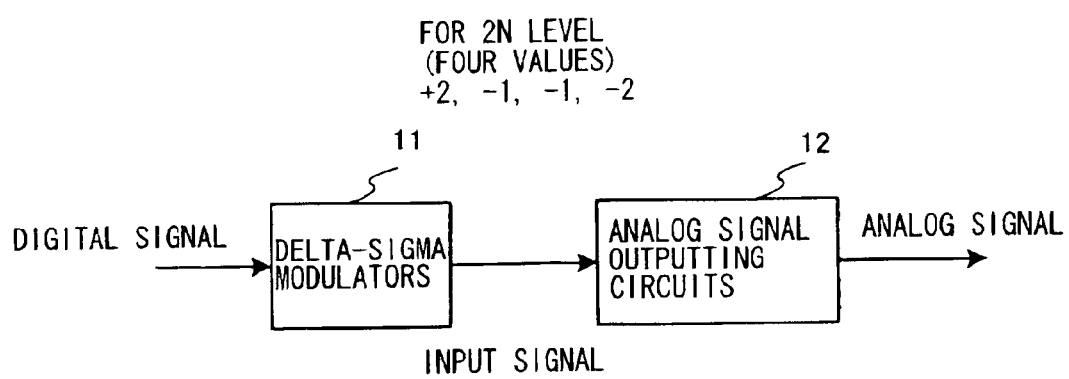
FIG. 1 is a block diagram showing a first embodiment of the present invention.

FIG. 1 is a block diagram showing a first embodiment of the present invention in which the present invention has been applied to an over-sampling DAC. In FIG. 1, a digital input signal is sent to a four-valued delta-sigma modulator 11, constituted from a digital circuit, and thereby converted into four-valued outputs (2-bit outputs) of −2, −1, +1 and +2, which are then output to an analog signal outputting circuit 12 equivalent to a low-pass filter (LPF). The analog signal outputting circuit 12 processes code signals, corresponding to −2, −1, +1 and +2, supplied thereto from the four-valued delta-sigma modulator 11, to output an analog signal corresponding to −2, −1, +1 and +2.

FIG. 2 is an explanatory view for illustrating the configuration and the operation of the analog signal outputting circuit 12 of the present embodiment. This analog signal outputting circuit 12 includes two unit analog circuits B1 and B2 for outputting an analog signal corresponding to the level "−1" or "1", and a low-pass filter (LPF) for smoothing an output(s) of one or both of the unit analog circuits B1 and B2, as selected depending on a code output from the four-valued delta-sigma modulator 11. The operation of the present embodiment is now explained with reference to FIGS. 1 and 2.

In case the output value from the four-level delta-sigma modulator 11 is "+2", both the unit analog circuits B1 and B2 are selected and used as a "+1" analog signal output unit. A "+2" analog signal, obtained on summing the outputs of the unit analog circuits B1 and B2, is output from the low-pass filter (LPF) to produce an analog signal equivalent to "+2". In case the output value from the four-valued delta-sigma modulator 11 is "−2", both the unit analog circuits B1 and B2 are selected and used as a "−1" analog signal output unit. A "−2" analog signal, obtained on summing the outputs of the unit analog circuits B1 and B2, is output from the low-pass filter (LPF) to produce an analog signal equivalent to "−2".

In case the output value from the four-level delta-sigma modulator 11 is "+1", the unit analog circuit, different from the unit analog circuit selected in outputting the same code "+1" last time, is selected and used to output an analog signal equivalent to "+1". That is, in case the unit analog circuit B1 was selected in outputting the code "+1" last time, the unit analog circuit B2 is selected this time as the "+1" analog signal output unit to output the analog signal equivalent to "+1" and, in case the unit analog circuit B2 was selected in outputting the code "+1" last time, the unit analog circuit B1 is selected this time as the "+1" analog signal output unit to output the analog signal equivalent to "+1".

In similar manner, if, in case the value output from the four-valued delta-sigma modulator 11 is "−1", the analog circuit B1 was selected in outputting the code "−1" last time, the unit analog circuit B2 is selected this time as the "−1" analog signal output unit to output the analog signal equivalent to "−1" and, in case the unit analog circuit B2 was selected in outputting the code "−1" last time, the unit analog circuit B1 is selected this time as the "−1" analog signal output unit to output the analog signal equivalent to "−1".

Figure 3:
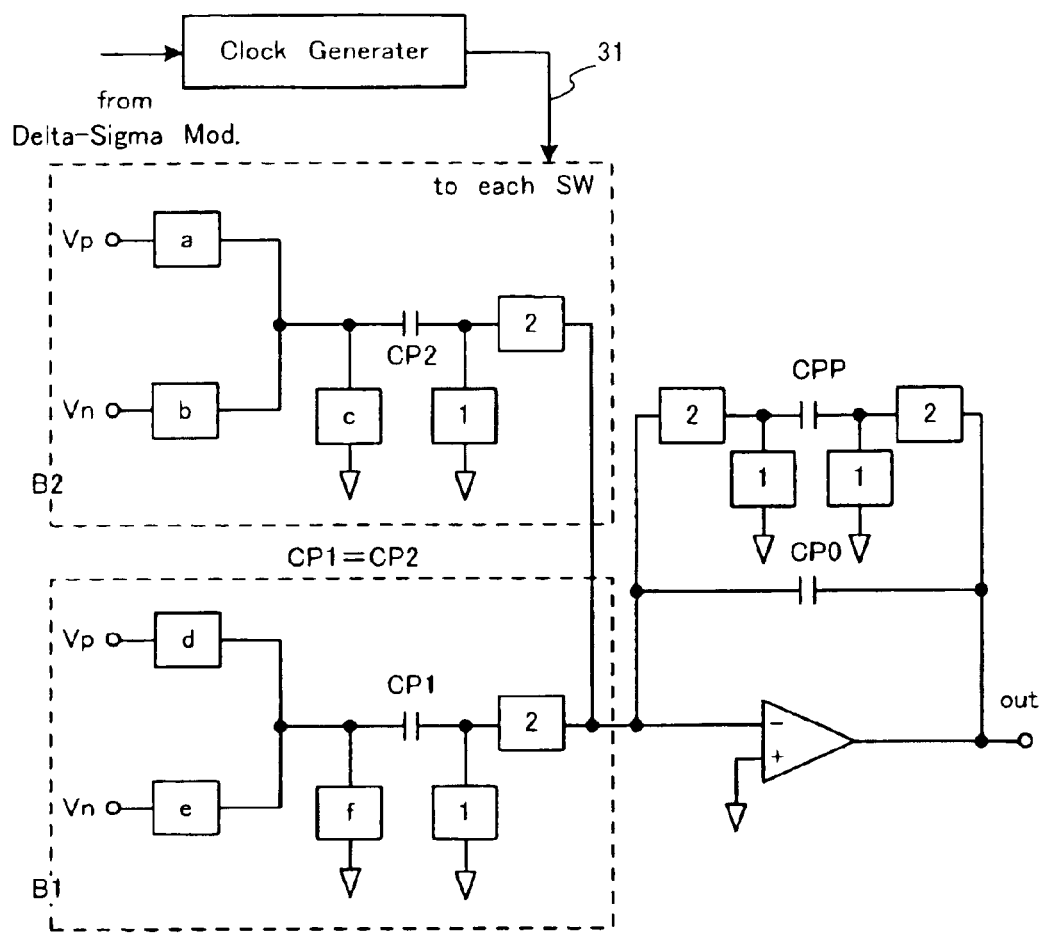
FIG. 3 shows an embodiment in which the analog signal outputting circuit of the present embodiment is formed by a switched capacitor circuit (SC circuit).

FIG. 3 is a block diagram showing an embodiment in which the analog signal outputting circuit 12 is formed as a switched capacitor (SC) circuit. SC circuits B1 and B2, including the capacitors CP1 and CP2, correspond to the unit analog circuits B1 and B2. The capacitors CP1 and CP2 are set to equal values, and reference voltages Vp and Vn denote analog voltages equivalent to "+1" and "−1", respectively.

Figure 4:
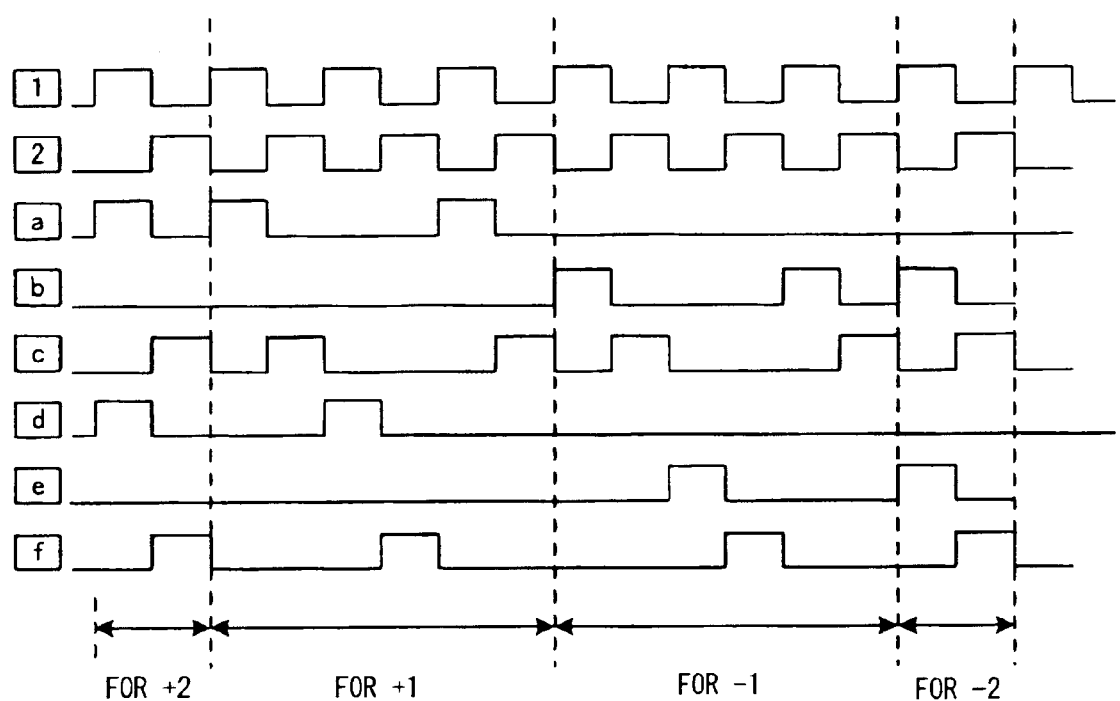
FIG. 4 is a timing chart for illustrating the operation of the present embodiment.

In FIG. 3, an output of the delta-sigma modulator 11 of the previous stage is input to a clock generator 31, an output of which is used for on/off control of SC circuitry (SW1, SW2, SWa, SWb, SWc, SWd, SWe and SWf). FIG. 4 is a timing chart for illustrating the operation of the respective switches that are on/off controlled in outputting an analog signal equivalent to +2, +1, −1 and −2 by the SC circuits shown in FIG. 3. The operation of the present embodiment is now explained by referring to FIGS. 3 and 4.

In case the value output from the four-valued delta-sigma modulator 11 is "+2", SWa, SWd and SW1 are turned on with the first phase of the clock cycle to store electric charge corresponding to the reference voltage Vp in the capacitors CP1 and CP2. With the second phase of the clock cycle, SWc, SWf and SW2 are turned on to add to the electric charge corresponding to the reference voltage Vp, already stored in the capacitors CP1 and CP2, to output the stored charges to a downstream side low-pass filter. Thus, an analog signal corresponding to "+2" is output from the low-pass filter (LPF).

If the value output from the four-valued delta-sigma modulator 11 is "−2", SWb, SWe and SW1 are turned on with the first phase of the clock cycle to store electric charge corresponding to the reference voltage Vn in the capacitors CP1 and CP2. With the second phase of the clock cycle, SWc, SWf and SW2 are turned on to add to the electric charge corresponding to the reference voltage Vn, already stored in the capacitors CP1 and CP2, to output the stored charge to the downstream side low-pass filter (LPF). Thus, an analog signal corresponding to "−2" is output from the low-pass filter (LPF).

If, in case the value output from the four-valued delta-sigma modulator 11 is "+1", the capacitor CP1 of the unit analog circuit B1 was selected in outputting the same code "+1" last time, such that an analog signal corresponding to "+1" was output, the capacitor CP2 of the unit analog circuit B2 is used this time as a capacitor for outputting the analog signal "+1". Hence, SWa and SW1 are turned on with the first phase of the clock cycle to store electric charge corresponding to the reference voltage Vp in the capacitor CP2, and SWc and SW2 are turned on with the second phase of the clock cycle to output the electric charge, corresponding to the reference voltage Vp, stored in the capacitor CP2, to the downstream side low-pass filter (LPF). Thus, the low-pass filter (LPF) outputs an analog signal, equivalent to "+1", charged in the capacitor CP2.

In case "+1" is output in succession from the four-valued delta-sigma modulator 11, the capacitor CP1 of the unit analog circuit B1 is used this time as a capacitor for outputting an analog signal for "+1". Hence, SWd and SW1 are turned on with the next first phase of the clock cycle to store electric charge corresponding to the reference voltage Vp in the capacitor CP1, and SWf and SW2 are turned on with the second phase of the clock cycle to output the electric charge, corresponding to the reference voltage Vp, stored in the capacitor CP1, to the downstream side low-pass filter (LPF). Thus, the low-pass filter (LPF) outputs an analog signal, equivalent to "+1", charged in the capacitor CP1.

Thenceforth, the unit analog circuits B1 and B2 are alternately in operation, in a switched manner, each time "+1" is output from the four-valued delta-sigma modulator 11, to output an analog signal equivalent to "+1" output from the four-valued delta-sigma modulator 11.

In similar manner, if, in case the value output from the four-valued delta-sigma modulator 11 is "−1", the capacitor CP1 of the unit analog circuit B1 was selected in outputting the same code "−1" last time, such that an analog signal corresponding to "−1" was output, the capacitor CP2 of the unit analog circuit B2 is used this time as a capacitor for outputting the analog signal "−1". Hence, SWb and SW1 are turned on with the first phase of the clock cycle to store electric charge corresponding to the reference voltage Vn in the capacitor CP2, and SWc, SW2 are turned on with the second phase of the clock cycle to output the electric charge, corresponding to the reference voltage Vn, stored in the capacitor CP2, to the downstream side low-pass filter (LPF). Thus, the low-pass filter (LPF) outputs an analog signal, equivalent to "−1", charged in the capacitor CP2.

In case "−1" is output in succession from the four-valued delta-sigma modulator 11, the capacitor CP1 of the unit analog circuit B1 is used this time as a capacitor for outputting an analog signal for "−1". Hence, SWe and SW1 are turned on with the next first phase of the clock cycle to store electric charge corresponding to the reference voltage Vn in the capacitor CP1, and SWf and SW2 are turned on with the second phase of the clock cycle to output the electric charge, corresponding to the reference voltage Vn, stored in the capacitor CP1, to the downstream side low-pass filter (LPF). Thus, the low-pass filter (LPF) outputs an analog signal, equivalent to "−1", charged in the capacitor CP1.

Thenceforth, the unit analog circuits B1 and B2 are alternately in operation, in a switched manner, each time "−1" is output from the four-valued delta-sigma modulator 11, to output an analog signal equivalent to "−1" output from the four-valued delta-sigma modulator 11.

Figure 5:
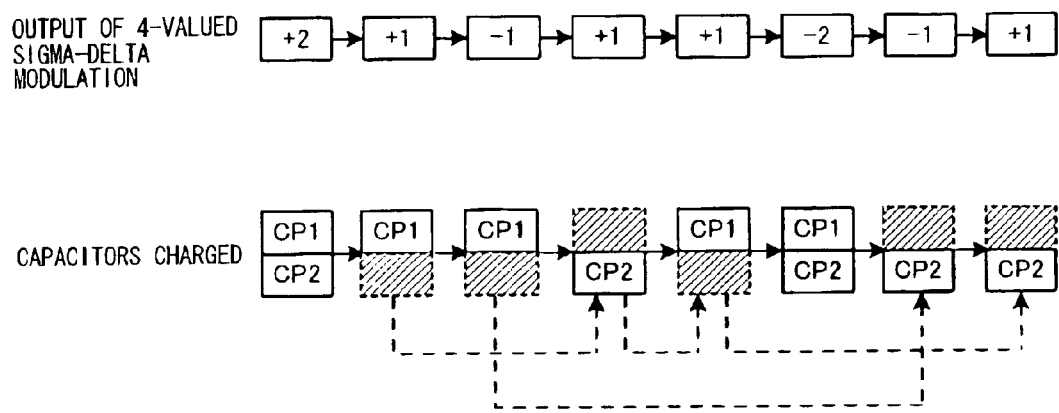
FIG. 5 chronologically shows an example of the selection sequence of capacitors in the present embodiment in which are charged electric charge.

FIG. 5 shows an exemplary order of selection of the capacitors CP1 and CP2 in the embodiment of FIG. 3 in which electric charge are stored when any one of −2, −1, +1 and +2 is output as time-domain signals from the four-valued delta-sigma modulator 11. In the present embodiment, in case "−1" or "+1" is output as time-domain signal from the four-valued delta-sigma modulator 11, the capacitors CP1 and CP2 are scrambled to charge one of the capacitors, whereas, in case "−2" or "+2" is output, the two capacitors are charged at all times.

In scrambling, the respective switches are controlled in switched fashion, for outputs from the four-valued delta-sigma modulator 11 of "−1" and "+1", so that the capacitor which is not the capacitor used last time is used independently. This operation allows cancellation of the deterioration of characteristics otherwise caused by the relative error in the two capacitors ascribable to manufacture errors (variations in capacitance).

Figure 6:
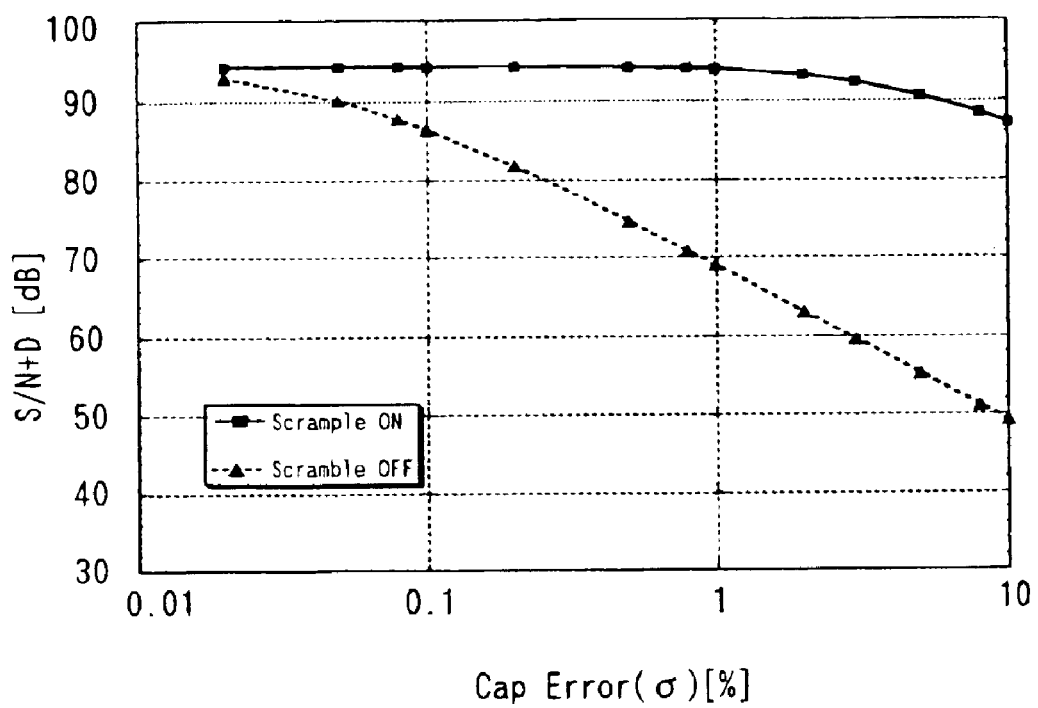
FIG. 6 is a graph showing S/(N+D) characteristics with respect to the relative error of the capacity of the present embodiment.

FIG. 6 is a graph simulating the S/(N+D) characteristics, including manufacture tolerances (capacitance variations), for a case where the capacitor selected in case "−1" or "+1" is output from the four-valued delta-sigma modulator 11 is fixed to CP1 or CP2, and for a case where the capacitors are alternately selected independently for "−1" or "+1" (scrambling system), in a switching fashion, in the example shown in FIG. 3, under the supposition that the manufacture tolerances of the capacitance values of the capacitors follow the Gaussian distribution.

In FIG. 6, Typ and Min values indicate average and Min values obtained on 1,000 times of simulation operations. In case the system of the present invention of alternately switching between CP1 and CP2 is used, stable S/(N+D) values are obtained for all samples, even with the relative capacitance error of 1%. If conversely the capacitor used is fixed to CP1 or CP2, the characteristics of S/(N+D) are deteriorated as the relative precision of the capacitance value is worsened.

Figure 7:
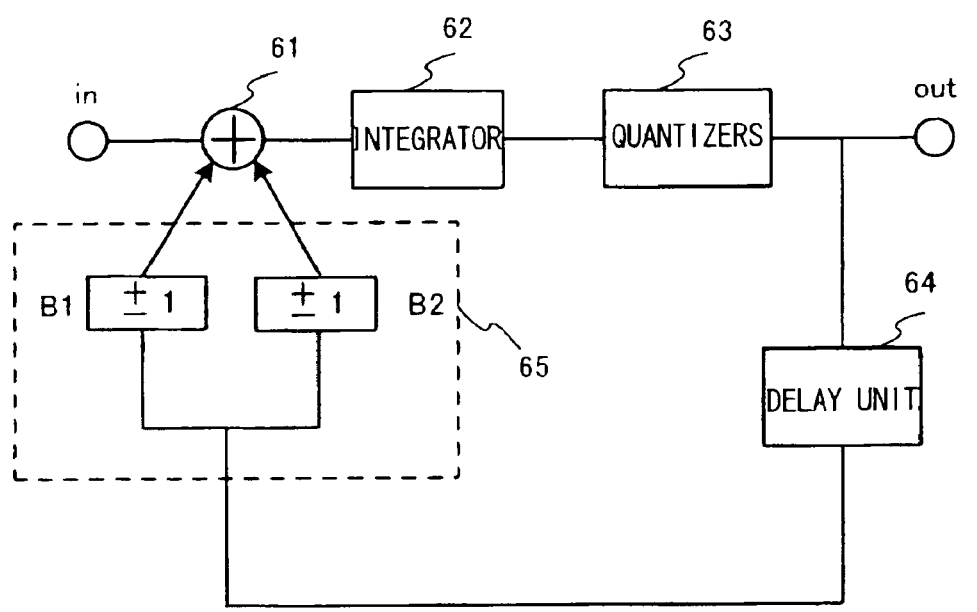
FIG. 7 is a block diagram showing a second embodiment of the present invention.

FIG. 7 is a block diagram showing a second embodiment of the present invention in which the invention is applied to an ADC of an order one four-valued delta-sigma modulator type.

The four-valued delta-sigma modulator 11 of the present embodiment is made up by a multi-level analog signal outputting circuit, constructed as a local DAC 65, adapted for converting a four-valued feedback signal into an analog signal, an analog adder 61 for taking a difference between an output signal of the local DAC 65 and an analog input signal in, an analog integrator 62 for integrating an output signal of the analog adder 61, a multi-level quantizer 63 for converting an output signal of the analog integrator 62 into four values of digital signals, and a delay unit 64 for delaying an output signal of the multi-level quantizer 63 to output the resulting delayed signal as four-valued feedback signals to the local DAC.

In this case, the present invention may be applied to a multi-level analog signal outputting circuit constructed as a local DAC 65 designed for converting the four-valued feedback signal into an analog signal. That is, by applying the unit analog circuits B1 and B2 of the present invention, in accordance with the four-valued output codes, obtained by the quantizer 63, and by employing the unit analog circuits B1 and B2, in accordance with the above-described sequence, it is possible to take up the errors ascribable to variations in the devices.

Figure 8:
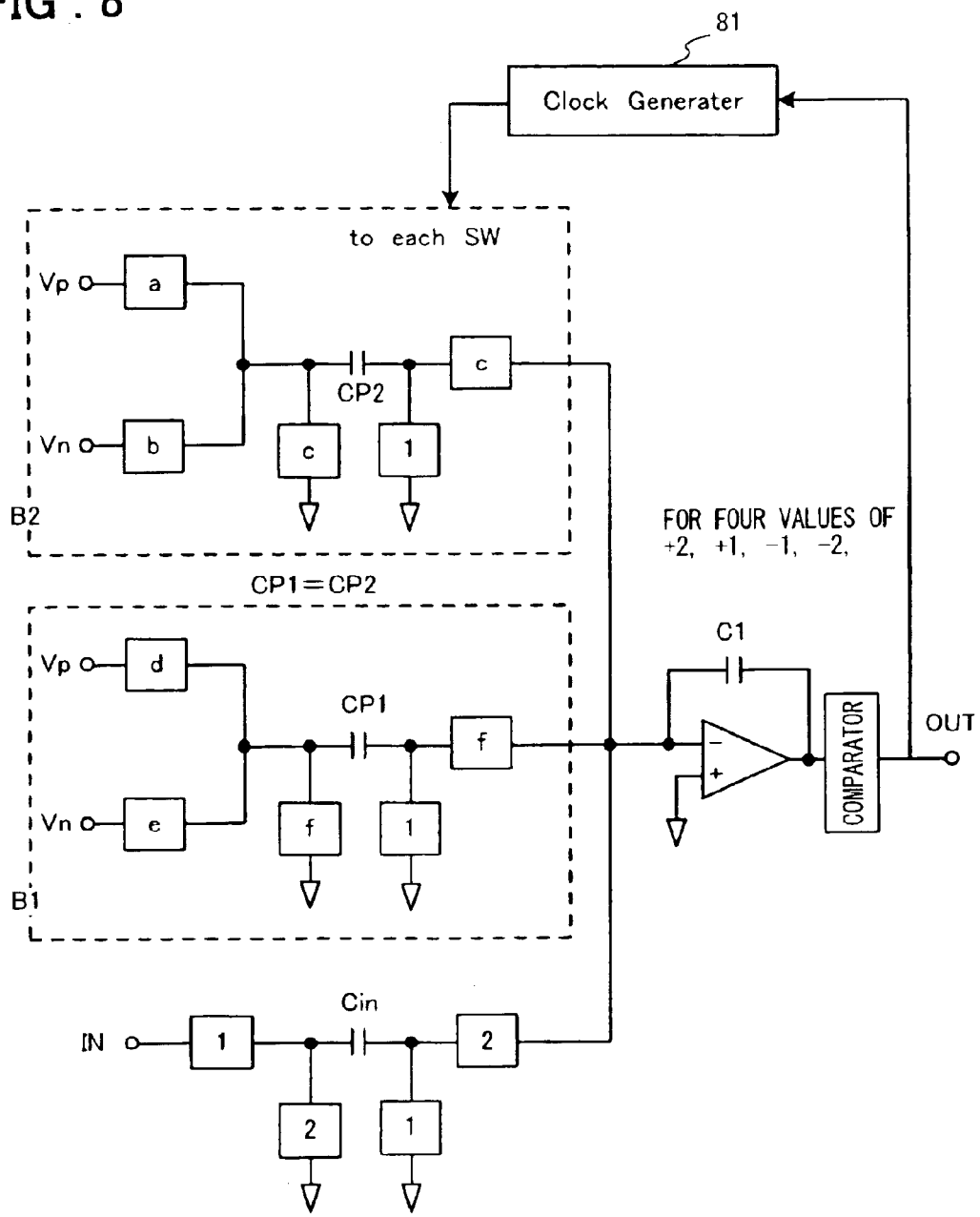
FIG. 8 shows the second embodiment formed by a switched capacitor circuit (SC circuit).

FIG. 8 is a block diagram showing an embodiment in which the order one four-valued delta-sigma modulator 11 of the previous embodiment is formed using switched capacitor circuits (SC circuits). In the present embodiment, SC circuits B1 and B2, including the capacitors CP1 and CP2, correspond to the unit analog circuits B1 and B2 of FIG. 7. The capacitors CP1 and CP2 are set to equal values. The reference voltages Vp, Vn are analog voltages equivalent to "+1" and to "−1", respectively.

Figure 9:
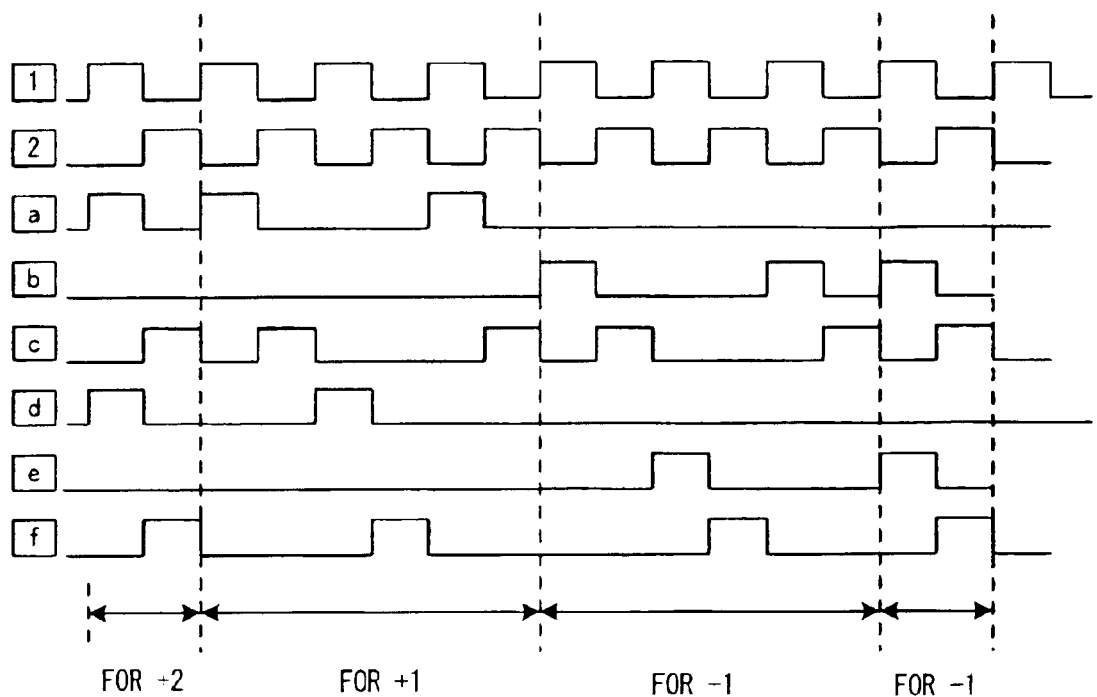
FIG. 9 is a time chart for illustrating the operation in the present embodiment.

Referring to FIG. 8, the an output of a comparator, equivalent to the quantizer 63, is supplied to a clock generator 81, an output of which controls switches SW1, SW2, SWa, SWb, SWc, SWd, SWe and SWf of the SC circuitry on or off. FIG. 9 is a timing chart showing the operation of the respective switches controlled on or off when an analog signal corresponding to the four values of "+1", "−1", "+2" and "−2" is output from the SC circuits shown in FIG. 8.

The circuit shown operates as an output unit for outputting an analog signal, equivalent to +2, +1, −1 and −2, by controlling the respective switches in dependence upon the previous output codes, as in the example of the SC circuit shown in FIGS. 3 and 4, so that the circuit shown operates in its entirety as a delta-sigma modulator. The capacitors CP1 and CP2 are able to output an analog signal of the respective levels to a high accuracy despite variations in the capacitors CP1 and CP2. The switch on/off control operations of the present embodiment are the same as those explained with reference to FIGS. 3 and 4 and hence are not explained in detail.

Figure 10:
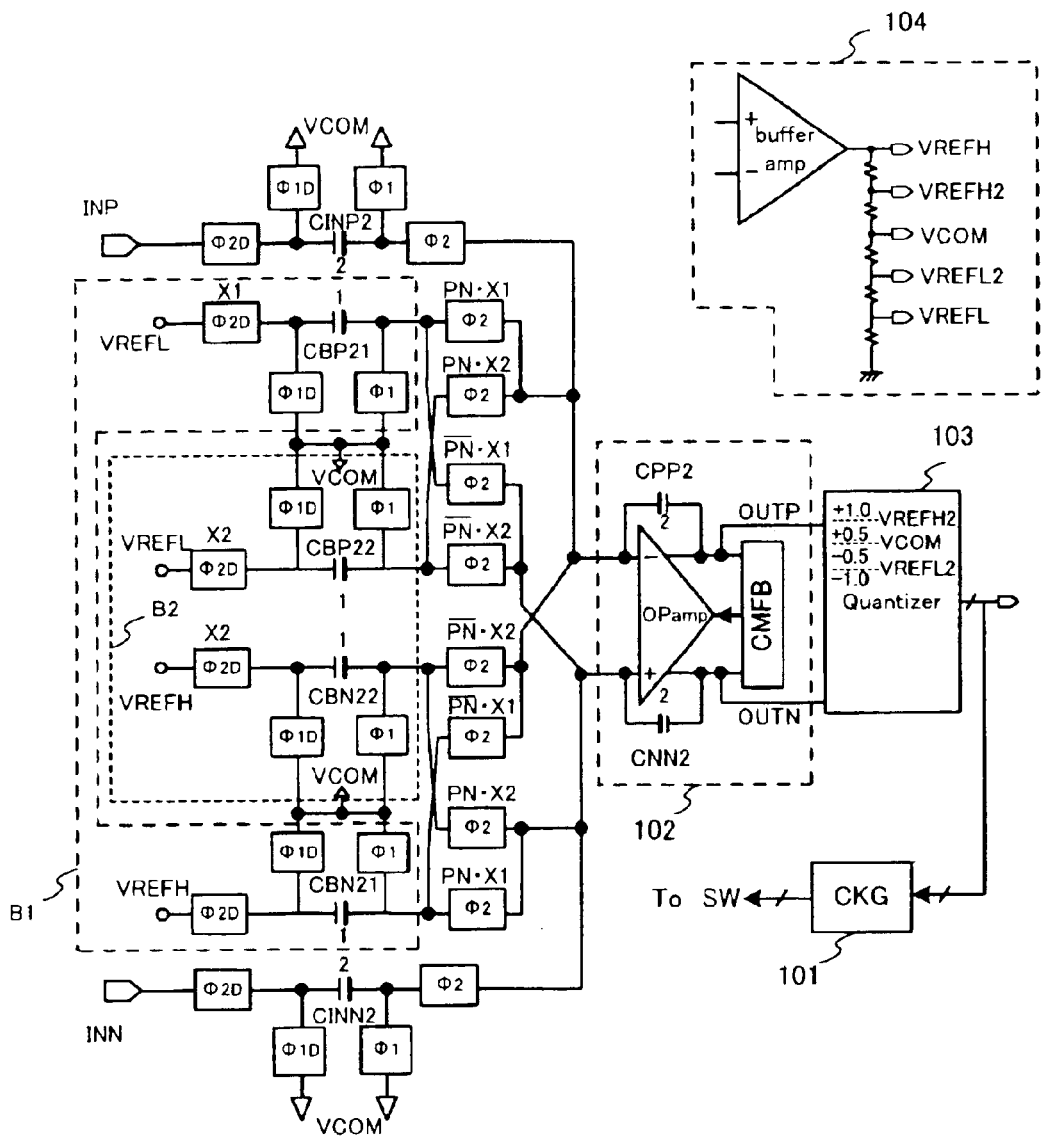
FIG. 10 shows the second embodiment formed by a switched capacitor circuit (SC circuit) as an equilibrium circuit network.

FIG. 10 is a block circuit diagram showing an embodiment in which the order-one four-valued delta-sigma modulator in the embodiment of FIG. 7 is constructed as an equilibrium circuit network by a switched capacitor circuit (SC circuit). Two capacitors each are provided on both the positive and negative sides of the integrator 102 for converting the four-valued output of the delta-sigma modulator into an analog signal. These four-valued output includes ±1.0 and ±0.5 and correspond to +2, +1, −1 and −2 of the previous embodiment. That is, the SC circuits B1 and B2, composed of capacitors CBP21 and CBN22 and capacitors CBP22 and CBN22, correspond to the unit analog circuits B1 and B2, respectively. The capacitances of these capacitors are all set to equal values.

In FIG. 10, an analog voltage from the SC circuits B1 and B2 are supplied via integrator 102 to a quantizer 103, and is compared in this quantizer 103 to the reference voltage generated from a reference voltage generating circuit 104 so as to be thereby converted into four-valued outputs (±1.0 and ±0.5). An output of the quantizer 103 is supplied to a clock generator 101. The respective switches of the SC circuitry are controlled on or off by an output of the clock generator 101. The schematics of the SC circuits B1 and B2 of the present embodiment are hereinafter explained.

With the first phase (f 1) of the clock cycle, the clock generator 101 causes electric charge, corresponding to the reference voltage VREFL-VCOM, to be stored in the capacitors CBP21 and CBP22, while causing electric charge, corresponding to the reference voltage VREFH-VCOM, to be stored in the capacitors CBN21 and CBN22.

If the output value from the quantizer 103 is "+1.0", the electric charge, corresponding to the reference voltage VREFL-VCOM, stored in the capacitors CBP21 and CBP22, are input to the negative side of the integrator 102, whilst the electric charge, corresponding to the reference voltage VREFH-VCOM, stored in the capacitors CBN21 and CBN22, are input to the positive side of the integrator 102, with the second phase (f 2) of the clock cycle, whereby an analog signal corresponding to "+1.0" is output from the integrator 102.

If the output value from the quantizer 103 is "−1.0", the electric charge, corresponding to the reference voltage VREFL-VCOM, stored in the capacitors CBP21 and CBP22, are input to the positive side of the integrator 102, whilst the electric charge, corresponding to the reference voltage VREFH-VCOM, stored in the capacitors CBN21 and CBN22, are input to the negative side of the integrator 102, with the second phase (f 2) of the clock cycle, whereby an analog signal corresponding to "−1.0" is output from the integrator 102.

If, in case the output value from the quantizer 103 is "+0.5", the capacitors CBP21 and CBN 21 of the unit analog circuit B1 were selected in outputting the same code "+0.5" last time, and the electric charge, corresponding to the reference voltage VREFL-VCOM, stored in the capacitor CBP21, were input to the negative side of the integrator 102, whilst the electric charge, corresponding to the reference voltage VREFH-VCOM, stored in the capacitor CBN21, were input to the positive side of the integrator 102, with the second phase (f 2) of the clock cycle, whereby an analog signal corresponding to "+0.5" was output from the integrator 102, the capacitors CBP22 and CBN22 of the unit analog circuit B2 are selected this time, and the electric charge, corresponding to the reference voltage VREFL-VCOM, stored in the capacitor CBP22, are input to the negative side of the integrator 102, whilst the electric charge, corresponding to the reference voltage VREFH-VCOM, stored in the capacitor CBN22, are input to the positive side of the integrator 102, with the second phase (f 2) of the clock cycle, whereby an analog signal corresponding to "+0.5" is output from the integrator 102.

Thenceforth, each time a value "+0.5" is output from the quantizer 103, the unit analog circuits B1 and B2 for outputting the stored charges to the integrator 102 are alternately selected, in a switched fashion, whereby an analog signal corresponding to "+0.5" is output from the integrator 102.

In similar manner, if, in case the output value from the quantizer 103 is "−0.5", the capacitors CBP21 and CBN21 of the unit analog circuit B1 were selected in outputting the same code "−0.5" last time, the electric charge, corresponding to the reference voltage VREFL-VCOM, stored in the capacitor CBP21, were input to the positive side of the integrator 102, whilst the electric charge, corresponding to the reference voltage VREFH-VCOM, stored in the capacitor CBN21, were input to the negative side of the integrator 102, with the second phase (f 2) of the clock cycle, whereby an analog signal corresponding to "−0.5" was output from the integrator 102, the capacitors CBP22 and CBN22 of the unit analog circuit B2 are selected this time, the electric charge, corresponding to the reference voltage VREFL-VCOM, stored in the capacitor CBP22, are input to the positive side of the integrator 102, whilst the electric charge, corresponding to the reference voltage VREFH-VCOM, stored in the capacitor CBN22, are input to the negative side of the integrator 102, with the second phase (f 2) of the clock cycle, whereby an analog signal corresponding to "−0.5" is output from the integrator 102.

Thenceforth, each time a value "−0.5" is output from the quantizer 103, the unit analog circuits B1 and B2 for outputting the stored charges to the integrator 102 are alternately switched, whereby an analog signal corresponding to "−0.5" is output from the integrator 102.

Figure 11:
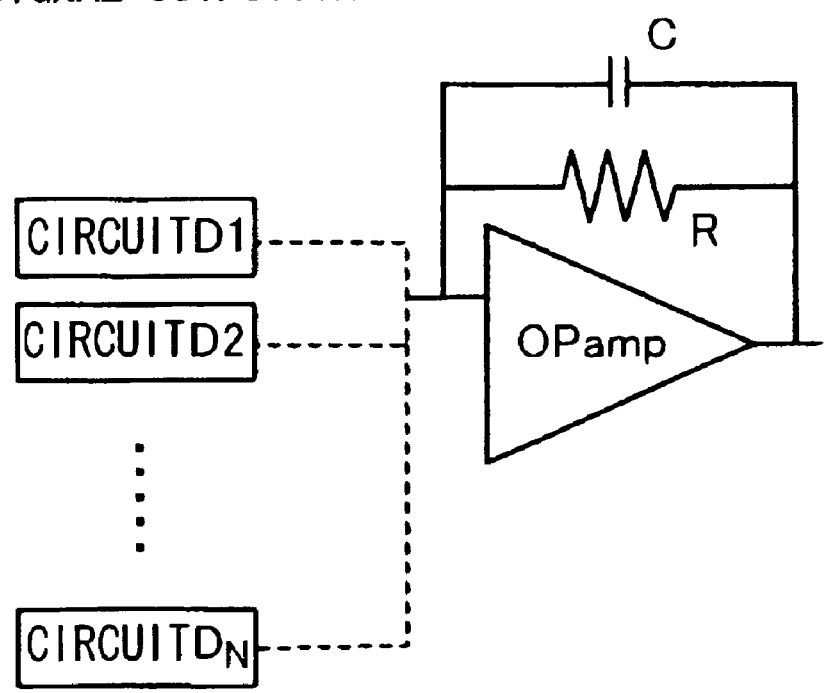
FIG. 11 is a block diagram showing a third embodiment of the present invention.
Figure 12:
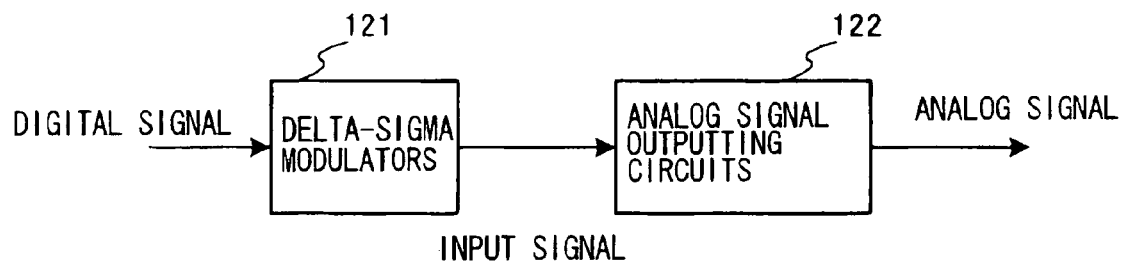
FIG. 12 is a block diagram showing a conventional illustrative structure in which the delta-sigma modulator has been applied to a D/A converter.
Figure 13:
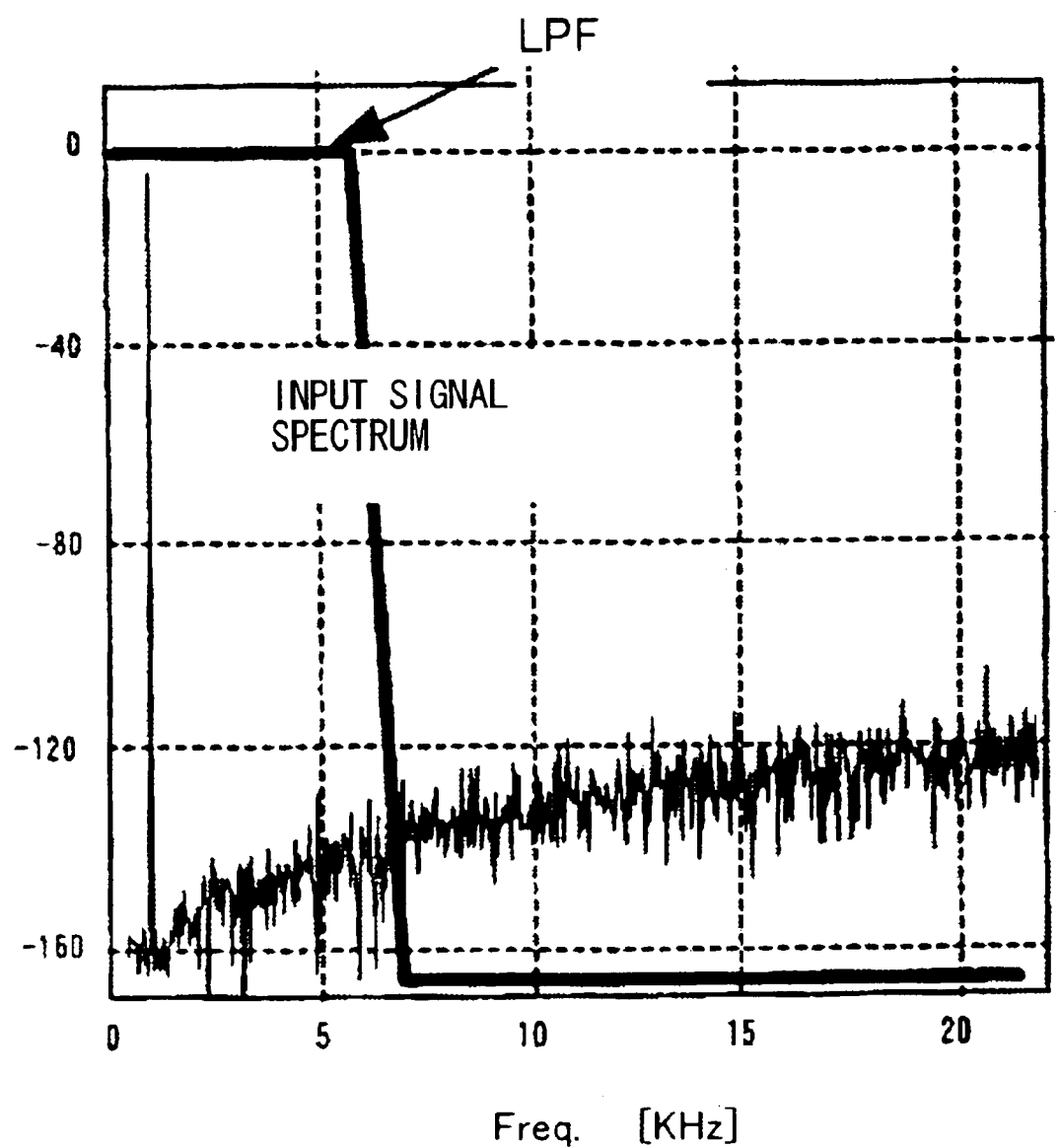
FIG. 13 is a graph showing an output spectrum in case the order-one delta-sigma modulator has been applied to a DA converter.

FIG. 11 is a block circuit showing a third embodiment of the present invention, and shows a multi-level analog signal outputting circuit in case the ADC of the order one four-valued delta-sigma modulator type is expanded to a 2N (−N, −N+1, . . . , −2, −1, 1, 2, . . . , N−1, N; N being an integer not less than 2) level type.

In the present embodiment, N unit analog circuits D1 to DN, each outputting an analog signal corresponding to a level "−1" or a level "1", are provided, all of the unit analog circuits are used as analog output units outputting "−1" or "1" if the input code is +N or −N and, if the input code is −M or M, where M is an integer such that 1≦M≦N−1, outputs of the M unit analog circuits, selected from N unit analog circuits, are summed together to output an analog signal equivalent to the code −M or M.

In selecting the combination of M unit analog circuits, switching is made sequentially to different combinations of M unit analog circuits, in dependence upon the different combinations afforded by $_NC_M$, where C is an operator denoting the combination, each time a code corresponding to −M or M is entered. That is, different combinations from the circuits D1 to DN are sequentially used, from one code to another and, when the last combination is reached, reversion is made to the first combination, to avoid the use of the combination used for the same code entered last time. In this manner, the combinations of M unit analog circuits are sequentially changed (scrambled) so that all circuits will be used impartially.

For 6 levels (N=3), for example, the levels that may be expressed are ±(1 to 3). If M=±1, D1, D2, D3, . . . , are selected sequentially. If M=±2, the totality of the combinations of $_3C_2$ (D1, D2), (D1, D3) and (D2, D3) are used in this order and, if M=±3, the combination (D1, D2, D3) (all circuits) are used.

For 2N levels, the levels that may be expressed are ±(1 to N). If, in this case, M=±1, D1, D2, D3, . . . , DN, are selected sequentially. If M=±2, the totality of the combinations of $_NC_2$ (D1, D2), (D1, D3), (D1, D4), . . . , (D1, DN), (D2, D3), (D2, D4), . . . , ($D_{N-1}$, $D_N$), are selected in this order and, if M=±3, the totality of the combinations of $_NC_3$ (D1, D2, D3), (D1, D2, D4), . . . , (D1, D2, DN), (D2, D3, D4), (D2, D3, D5), . . . , ($D_{N-2}$, $D_{N-1}$, $D_N$), are selected in this order, and so forth, such that, for M=±(N−1), all combinations of NCN−1, that is, (D1, D2, D3, . . . , DN−1), (D1, D2, . . . , DN−2, DN), . . . , (D1, D3, D4, . . . , DN), (D2, D3, D4, . . . , DN), are selected in this order and, for M=±N, the combination of (D1, D2, D3, . . . , $D_N$) (all circuits) are used.

Meanwhile, the multi-level analog signal outputting circuit of the present invention may similarly be applied to an order n−N level delta-sigma modulator, where n is an integer such that n=2 and N is an integer not less than 2. The multi-level analog signal outputting circuit is not limited to the application of the multi-level delta-sigma modulator and may be suitably employed as an analog signal outputting circuit supplied with codes corresponding to 2N levels (−N, −N+1, . . . , −2, −1, 1, 2, . . . , N−1, N, where N is an integer not less than 2.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A multi-level analog signal outputting circuit receiving as an input codes corresponding to 2N (−N, −N+1, . . . , −2, −1, 1, 2, . . . , N−1, N, where N being an integer not less than 2) levels, for outputting an analog signal corresponding to the input code, said multi-level analog signal outputting circuit comprising:

N pieces of unit analog circuits each outputting an analog signal corresponding to a level "−1" or "1";

a circuit for outputting an analog signal corresponding to a code −N or N, by summing outputs of the N pieces of unit analog circuits together, when the code corresponding to −N or N is input, and for outputting an analog signal corresponding to a code −M or M, M being an integer such that 1 ≦M≦N−1, by summing outputs of M unit analog circuits, selected from the N pieces of unit analog circuits, when the code corresponding to −M or M, is input; and a circuit for sequentially switching, each time the same code corresponding to the −M or M is input, the selected M unit analog circuits to respective different combinations of M unit analog circuits, in accordance with combinations afforded from the N pieces of unit analog circuits by $_NC_M$, where C is an operator representing the combination.

2. A multi-level analog signal outputting circuit receiving as an input codes corresponding to four (−2, −1, 1 and 2) levels, for outputting an analog signal corresponding to the input code, said multi-level analog signal outputting circuit comprising two unit analog circuits each outputting an analog signal corresponding to a level "−1" or "1";

a circuit for outputting an analog signal corresponding to a code −1 or 1, by summing outputs of said two unit analog circuits together, when said code corresponding to −2 or 2 is input, and for outputting an analog signal corresponding to a code −1 or 1, by an output of one unit analog circuit as selected from said two unit analog circuits, when said code corresponding to −1 or 1, is input; and a circuit for sequentially switching, each time the same code corresponding to said −1 or 1 is input, the sole unit analog circuit as selected from said two unit analog circuits.

3. The multi-level analog signal outputting circuit according to claim 1, wherein said unit analog circuit includes a switched capacitor (SC) circuit comprising:

a voltage source for supplying the voltage corresponding to a level "−1" or "1";

a capacitor; and a switch for outputting an analog signal equivalent to said level "−1" or "1", by being controlled to be turned on or off by an external control clock signal and by controlling the charging/discharging of electric charge from said voltage source as to the capacitor.

4. The multi-level analog signal outputting circuit according to claim 2, wherein said unit analog circuit includes a switched capacitor (SC) circuit comprising:

a voltage source for supplying the voltage corresponding to a level "−1" or "1";

a capacitor; and a switch for outputting an analog signal equivalent to said level "−1" or "1", by being controlled to be turned on or off by an external control clock signal and by controlling the charging/discharging of electric charge from said voltage source as to the capacitor.

5. A DA converter including:

a multi-level delta-sigma modulator for modulating an input digital signal into a signal of 2N (−N, −N+1, ..., −2, −1, 1, 2, ..., N−1, N, N being an integer not less than 2) levels; and a multi-level analog signal outputting circuit for converting codes corresponding to said 2N levels supplied from said delta-sigma modulator into an analog signal and for outputting the analog signal, wherein said multi-level analog signal outputting circuit comprises:

N pieces of unit analog circuits each outputting an analog signal corresponding to a level "−1" or "1";

a circuit for outputting an analog signal corresponding to a code −N or N, by summing outputs of said N pieces of unit analog circuits together, when said code corresponding to −N or N is input, and for outputting an analog signal corresponding to a code −M or M, M being an integer such that $1 \leq M \leq N-1$, by summing outputs of M unit analog circuits, selected from said N pieces of unit analog circuits, when said code corresponding to −M or M, is input; and a circuit for sequentially switching, each time the same code corresponding to said −M or M is input, the selected M unit analog circuits to respective different combinations of M unit analog circuits, in accordance with combinations afforded from said N pieces of unit analog circuits by $_NC_M$, where C is an operator representing the combination.

6. A DA converter including:

a four-valued sigma-delta modulator for modulating an input digital signal into a signal composed of four (−2, −1, 1 and 2) levels; and a multi-level analog signal outputting circuit for converting codes corresponding to said four levels, input from said sigma-delta modulator, into an analog signal and for outputting the analog signal, wherein said multi-level analog signal outputting circuit comprises:

two unit analog circuits each outputting an analog signal corresponding to a level "−1" or "1";

a circuit for outputting an analog signal corresponding to a code −2 or 2, by summing outputs of said two unit analog circuits together, when said code corresponding to −2 or 2 is input, and for outputting an analog signal corresponding to a code −1 or 1, by an output of one unit analog circuit, selected from said two unit analog circuits, when said code corresponding to −1 or 1, is input; and a circuit for alternately selecting, each time the same code corresponding to said −1 or 1 is input, the sole unit analog circuit selected from said two unit analog circuits.

7. The DA converter according to claim 5, wherein said unit analog circuit includes a switched capacitor (SC) circuit comprising:

a voltage source for supplying the voltage corresponding to a level "−1" or "1";

a capacitor; and a switch for outputting an analog signal equivalent to said level "−1" or "1", by being controlled to be turned on or off by an external control clock signal to control the charging/discharging of electric charge from said voltage source as to the capacitor.

8. The DA converter according to claim 6, wherein said unit analog circuit includes a switched capacitor (SC) circuit comprising:

a voltage source for supplying the voltage corresponding to a level "−1" or "1";

a capacitor; and a switch for outputting an analog signal equivalent to said level "−1" or "1", by being controlled to be turned on or off by an external control clock signal to control the charging/discharging of electric charge from said voltage source as to the capacitor.

9. A multi-level delta-sigma modulator including:

a multi-level analog signal outputting circuit operating as a local DA converter for converting a 2N-valued feedback signal, where is an integer not less than 2, into an analog signal;

an analog adder for outputting the difference between an output signal of said local DA converter and an analog input signal;

an analog integrator for integrating an output signal of said analog adder, a multi-level quantizer for converting an output signal of said analog integrator into a 2N-valued digital signal; and a delay unit for delaying an output signal of said multi-level quantizer for outputting the delayed signal as 2N-valued feedback signals to said local DA converter; wherein said multi-level analog signal outputting circuit comprises:

N pieces of unit analog circuits each outputting an analog signal corresponding to a level "−1" or "1";

a circuit for outputting an analog signal corresponding to a code −N or N, by summing outputs of said N pieces of unit analog circuits together, when said code corresponding to −N or N is input, and for outputting an analog signal corresponding to a code −M or M, M being an integer such that $1 \leq M \leq N-1$, by summing outputs of M unit analog circuits, selected from said N pieces of unit analog circuits, when said code corresponding to −M or M, is input; and a circuit for sequentially switching, each time the same code corresponding to said −M or M is input, the selected M unit analog circuits to respective different combinations of M unit analog circuits, in accordance with combinations afforded from said N pieces of unit analog circuits by $_NC_M$, where C is an operator representing the combination.

10. A multi-level delta-sigma modulator including:

a multi-level analog signal outputting circuit operating as a local DA converter for converting a four-valued (−2, −1, 1 and 2) feedback signal into an analog signal;

an analog adder for outputting the difference between an output signal of said local DA converter and an analog input signal;

an analog integrator for integrating an output signal of said analog adder;

a multi-level quantizer for converting an output signal of said analog integrator into digital signals of said four values; and a delay unit for delaying an output signal of said multi-level quantizer for outputting the delayed signal as four-valued feedback signals to said local DA converter; wherein said multi-level analog signal outputting circuit comprises:

two unit analog circuits for outputting an analog signal corresponding to a level −1 or to a level 1;

a circuit for outputting an analog signal corresponding to a code −2 or 2, by summing outputs of said two unit analog circuits together, when said code corresponding to −2 or 2 is input, and for outputting an analog signal corresponding to a code −1 or 1, by summing outputs of two unit analog circuits, selected from said two unit analog circuits, when said code corresponding to −1 or 1, is input; and a circuit for alternately selecting, each time the same code corresponding to said −1 or 1 is input, the sole unit analog circuit selected from said two unit analog circuits.

11. A multi-level delta-sigma modulator according to claim 9, wherein said unit analog circuit includes a switched capacitor (SC) circuit comprising:

a voltage source for supplying the voltage corresponding to a level "−1" or "1";

a capacitor; and a switch for outputting an analog signal equivalent to said level "−1" or "1", by being controlled to be turned on or off by an external control clock signal to control the charging/discharging of electric charge from said voltage source as to the capacitor.

12. A multi-level delta-sigma modulator according to claim 10, wherein said unit analog circuit includes a switched capacitor (SC) circuit comprising:

a voltage source for supplying the voltage corresponding to a level "−1" or "1";

a capacitor; and a switch for outputting an analog signal equivalent to said level "−1" or "1", by being controlled to be turned on or off by an external control clock signal to control the charging/discharging of electric charge from said voltage source as to the capacitor.

* * * * *